(12) United States Patent
Jang et al.

(10) Patent No.: US 11,152,517 B2
(45) Date of Patent: Oct. 19, 2021

(54) SEMICONDUCTOR DEVICES

(71) Applicant: Samsung Electronics Co., Ltd., Suwon-si (KR)

(72) Inventors: Sunguk Jang, Suwon-si (KR); Kihwan Kim, Suwon-si (KR); Sujin Jung, Suwon-si (KR); Youngdae Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/734,537

(22) Filed: Jan. 6, 2020

(65) Prior Publication Data
US 2020/0381563 A1 Dec. 3, 2020

(30) Foreign Application Priority Data

May 27, 2019 (KR) .................. 10-2019-0061678

(51) Int. Cl.
| | |
|---|---|
| *H01L 29/08* | (2006.01) |
| *H01L 29/786* | (2006.01) |
| *H01L 29/423* | (2006.01) |
| *H01L 29/78* | (2006.01) |
| *H01L 29/06* | (2006.01) |
| *H01L 29/66* | (2006.01) |

(52) U.S. Cl.
CPC .... *H01L 29/78696* (2013.01); *H01L 29/0673* (2013.01); *H01L 29/0843* (2013.01); *H01L 29/0847* (2013.01); *H01L 29/4232* (2013.01); *H01L 29/42392* (2013.01); *H01L 29/66545* (2013.01); *H01L 29/7851* (2013.01); *H01L 29/7854* (2013.01)

(58) Field of Classification Search
CPC .......... H01L 29/0886; H01L 29/78696; H01L 29/0847; H01L 29/7851; H01L 29/0673; H01L 29/66545; H01L 29/4232; H01L 29/7854; H01L 29/0843; H01L 29/0869; H01L 29/42392
See application file for complete search history.

(56) References Cited

U.S. PATENT DOCUMENTS

| | | |
|---|---|---|
| 9,627,540 B1 | 4/2017 | Chen et al. |
| 9,818,878 B2 | 11/2017 | Huang et al. |
| 9,882,027 B2 | 1/2018 | Liao et al. |
| 9,991,261 B2 | 6/2018 | Mitard |
| 2016/0005657 A1* | 1/2016 | Krishnan ............. H01L 29/785 438/493 |

(Continued)

*Primary Examiner* — Feifei Yeung Lopez
(74) *Attorney, Agent, or Firm* — Harness, Dickey & Pierce, P.L.C.

(57) ABSTRACT

A semiconductor device includes an active region on a substrate extending in a first direction, the active region having an upper surface and sidewalls, a plurality of channel layers above the active region to be vertically spaced apart from each other, a gate electrode extending in a second direction to intersect the active region and partially surrounding the plurality of channel layers, and a source/drain region on the active region on at least one side of the gate electrode and in contact with the plurality of channel layers, and extending from the sidewalls of the active region having a major width in the second direction in a first region adjacent to a lowermost channel layer adjacent to the active region among the plurality of channel layer.

20 Claims, 18 Drawing Sheets

(56) References Cited

U.S. PATENT DOCUMENTS

| | | |
|---|---|---|
| 2017/0005195 A1* | 1/2017 | Ching .................. H01L 29/165 |
| 2018/0047832 A1 | 2/2018 | Tapily et al. |
| 2018/0151717 A1* | 5/2018 | Cheng ............... H01L 29/66795 |
| 2018/0151737 A1 | 5/2018 | Yang et al. |
| 2018/0175214 A1 | 6/2018 | Chen et al. |
| 2018/0331232 A1 | 11/2018 | Frougier et al. |
| 2018/0366544 A1 | 12/2018 | Chang et al. |

\* cited by examiner

SEMICONDUCTOR DEVICES

CROSS-REFERENCE TO RELATED APPLICATION(S)

This application claims benefit of priority to Korean Patent Application No. 10-2019-0061678 filed on May 27, 2019 in the Korean Intellectual Property Office, the disclosure of which is incorporated herein by reference in its entirety.

BACKGROUND

The present disclosure relates to a semiconductor device.

As demand for high-performance, high-speed, and/or multifunctional semiconductor devices increases, the degree of integration of semiconductor devices has also increased. In the manufacturing of semiconductor devices having micropatterns in line with a trend for high degrees of integration in semiconductor devices, it may be advantageous to implement patterns having relatively fine widths and/or spacings. Various efforts to develop semiconductor devices, including three-dimensional channels, have been made to overcome limitations in operating characteristics resulting from miniaturization and/or reduction of planar metal oxide semiconductor FETs (MOSFETs).

SUMMARY

Example embodiments provide a semiconductor device having improved electrical characteristics.

According to an example embodiment, a semiconductor device includes an active region on a substrate extending in a first direction, the active surface having an upper surface and sidewalls, a plurality of channel layers disposed on the active region to be vertically spaced apart from each other, a gate electrode extending in a second direction to intersect the active region and partially surrounding the plurality of channel layers, and a source/drain region on the active region on at least one side of the gate electrode and in contact with the plurality of channel layers. The source/drain region extends from the sidewalls of the active region and has a widest local width at the major width in the second direction in a first region adjacent to a lowermost channel layer adjacent to the active region among the plurality of channel layer.

According to an example embodiment, a semiconductor device includes an active region extending on a substrate in a first direction, first and second channel layers sequentially vertically spaced apart from each other above the active region, a gate electrode extending in a second direction to intersect the active region on the substrate and surrounding the first and second channel layers, and a source/drain region on the active region on at least one side of the gate electrode and disposed to be in contact with the first and second channel layers. The source/drain region has a first major width in the second direction in a region adjacent to the first channel layer and has a second major width, less than the first major width, in the second direction in a region adjacent to the second channel layer.

According to an example embodiment, a semiconductor device includes an active region extending on a substrate in a first direction, the active region having an upper surface and sidewalls, a gate electrode extending in a second direction to intersect the active region on the substrate, a plurality of channel layers on the active region to be vertically spaced apart from each other in a region in which the active region and the gate electrode intersect each other, spacer layers on the sidewalls of the active region in the second direction and exposing the upper surface and portions of the sidewalls of the active region, and a source/drain region on the active region on at least one side of the gate electrode and in contact with the plurality of channel layers. The source/drain region extends from the sidewalls of the active region, exposed by the spacer layers, to be inclined with respect to an upper surface of the substrate to have a width extending from both sides of the active region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
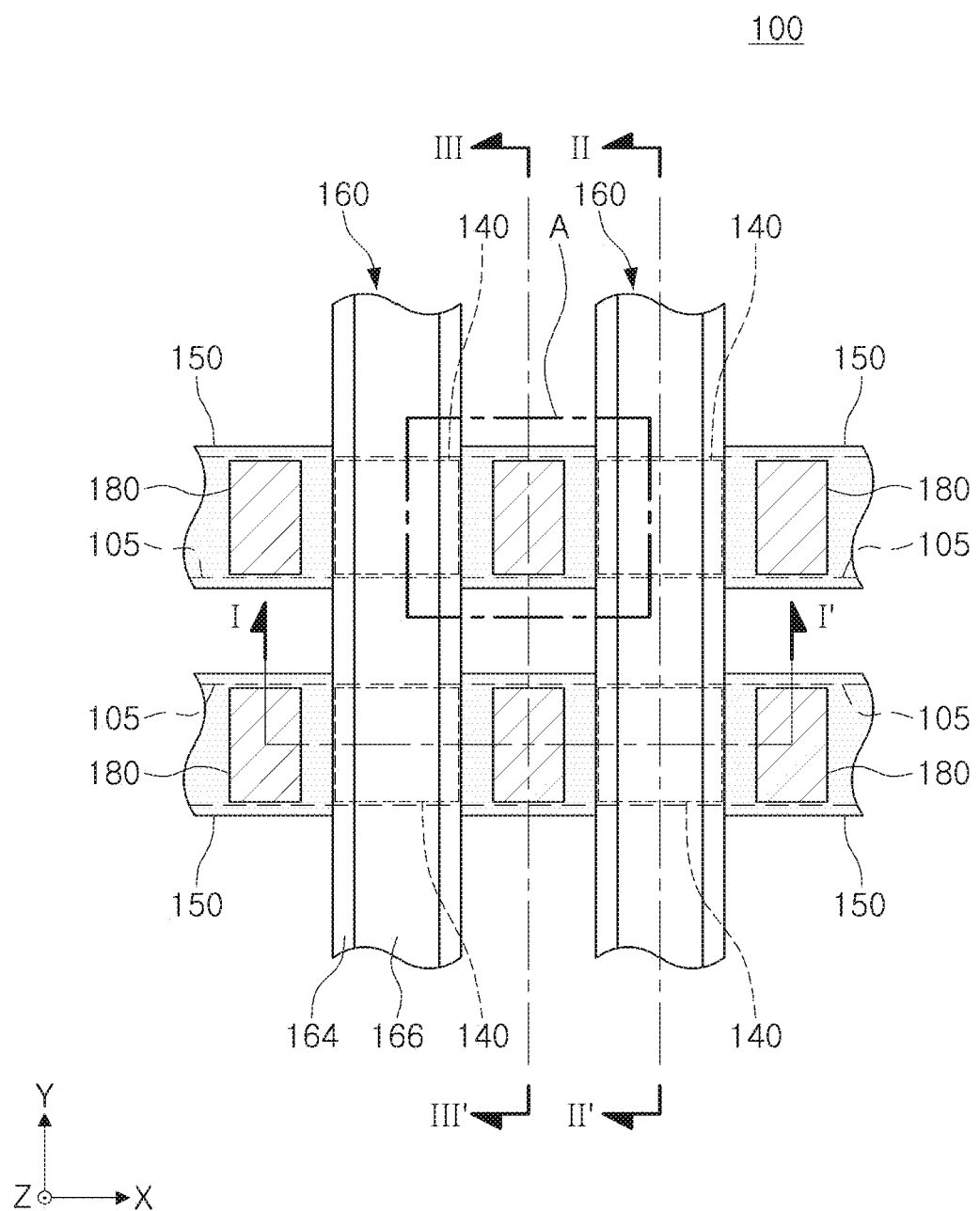
FIG. 1 is a top view of a semiconductor device according to example embodiments.

FIG. 1 is a top view of a semiconductor device according to example embodiments.

Figure 2:
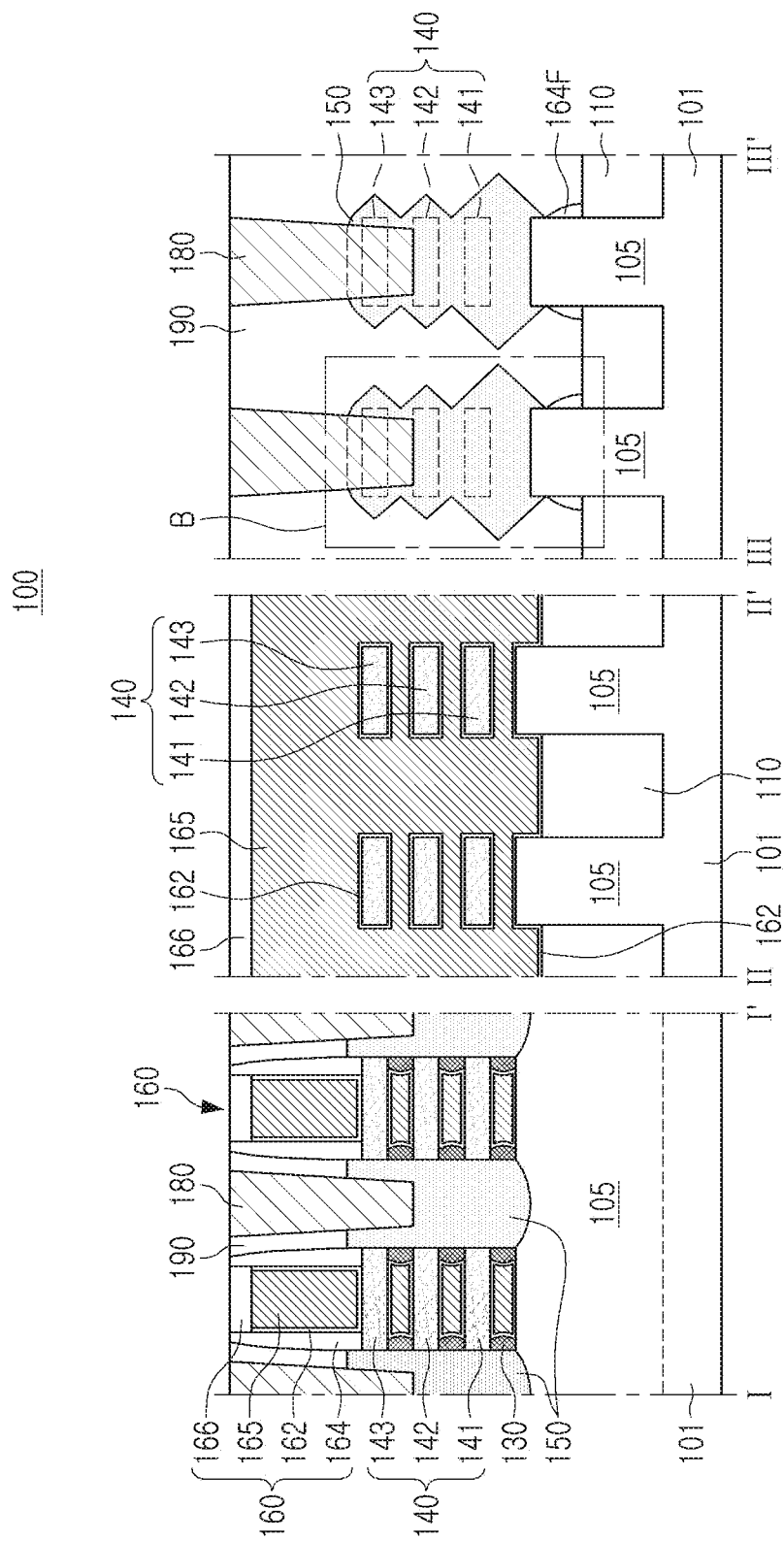
FIG. 2 is a cross-sectional view of a semiconductor device according to example embodiments.

FIG. 2 is a cross-sectional view of a semiconductor device according to example embodiments. FIG. 2 illustrates cross sections taken along lines I-I', II-IT, and III-III' of the semiconductor device of FIG. 1. For brevity of description, only main components of the semiconductor device are illustrated in FIGS. 1 and 2.

Referring to FIGS. 1 and 2, a semiconductor device 100 may include a substrate 101, active regions 105 on the substrate 101, channel structures 140, each including a plurality of channel layers 141, 142, and 143 disposed on the active regions 105 to be vertically spaced apart from each other, source/drain regions 150 in contact with the plurality of channel layers 141, 142, and 143, gate structures 160 extended to intersect the active region 105, and/or contact plugs 180 connected to the source/drain regions 150. The semiconductor device 100 may further include isolation layers 110, internal spacer layers 130, and/or an interlayer insulation layer 190. The gate structure 160 may include a gate dielectric layer 162, a gate electrode 165, spacer layers 164, and/or a gate capping layer 166.

In the semiconductor device 100, the active regions 105 may have a fin structure, and the gate electrode 165 may be disposed between the active region 105 and the channel structure 140 and between the plurality of channel layers 141, 142, and 143 of the channel structures 140. Accordingly, the semiconductor device 100 may include a MBCFET™ (Multi Bridge Channel FET) formed by the channel structures 140, the source/drain regions 150, and the gate structures 160.

The substrate 101 may have an upper surface extending in an x direction and a y direction. The substrate 101 may include a semiconductor material such as a group IV semiconductor, a group III-V compound semiconductor, or a group II-VI compound semiconductor. For example, the group IV semiconductor may include silicon, germanium or silicon germanium. The substrate 101 may be provided as a bulk wafer, an epitaxial layer, a silicon on insulator (SOI) layer, a semiconductor on insulator (SeOI) layer, or the like.

The active region 105 may be defined in the substrate 101 by the isolation layers 110 and may be disposed to extend in a first direction, for example, the x direction. The active region 105 may have an active fin structure protruding from the substrate 101. The active region 105 may be disposed such that an upper end thereof protrudes from top surfaces of the isolation layers 110 by a predetermined height. The active region 105 may include a portion of the substrate 101, or may include an epitaxial layer grown from the substrate 101. A portion of the active region 105 on the substrate 101 may be recessed on opposite sides adjacent to the gate structure 160, and the source/drain region 150 may be disposed on the recessed portion of the active region 105. Accordingly, the active region 105 may have a relatively greater height below the channel structure 140 and the gate structure 160, as illustrated in FIG. 2. In some embodiments, the active region 105 may include impurities, and at least portions of the active regions 105 may include impurities having conductivity types opposite to each other, but an example embodiment of the active regions 105 is not limited thereto.

The isolation layer 110 may define the active region 105 on the substrate 101. The isolation layer 110 may be formed by, for example, a shallow trench isolation (STI) process. The isolation layer 110 may be formed to expose upper sidewalls of the active regions 105. In some embodiments, the isolation layer 110 may include a region extending deeper to a lower portion of the substrate 101 between the active regions 105. The isolation layer 110 may have a curved top surface having a level becoming higher in a direction to the active region 105, but a shape of the top surface of the isolation layer 110 is not limited thereto. The isolation layer 110 may be formed of an insulating material. The isolation layer 110 may be, for example, an oxide, a nitride, or a combination thereof. As illustrated in FIG. 2, the isolation layer 110 may have different heights of the top surface below and outside of the gate structure 160. Such variation in shape is formed depending on the manufacturing process, and the height difference of the top surface may be changed according to example embodiments.

The channel structure 140 includes first to third channel layers 141, 142, and 143, a plurality of channel layers, disposed on the active region 105 to be spaced apart from each other in a direction perpendicular to the top surface of the active region 105, for example, a z direction. The first to third channel layers 141, 142, and 143 may be spaced apart from the top surface of the active region 105 while being connected to the source/drain regions 150. Each of the first to third channel layers 141, 142, and 143 may have a width equal or similar to a width of the active region 105 in a y direction, and may have a width equal or similar to a width of the gate structure 160 in the x direction. However, in some embodiments, the first to third channel layers 141, 142, and 143 may have decreased widths such that side surfaces thereof are disposed below the gate structure 160 in the x direction. Each of the first to third channel layers 141, 142, and 143 may be formed of a semiconductor material and may include at least one of silicon (Si), silicon germanium (SiGe), and germanium (Ge). The first to third channel layers 141, 142, and 143 may be formed of, for example, the same material as that of the substrate 101. The number and shape of the channel layers 141, 142, and 143, constituting a single channel structure 140, may be variously changed according to example embodiments.

The source/drain regions 150 may be disposed on active regions 105 at opposite sides adjacent to the gate structure 160. The source/drain regions 150 may be provided as a source region or a drain region of a transistor. Each of the source/drain regions 150 may be disposed such that an upper surface thereof is higher than an uppermost surface of the channel structure 140, and may be an elevated source/drain disposed to be higher than a bottom surface of the gate electrode 165 on the channel structure 140.

The source/drain regions 150 may be disposed on a region in which a portion of the active region 105 is recessed between the channel structures 140 and the gate structures 160 adjacent to each other in the x direction. The source/drain regions 150 may extend from a sidewall of the active region 105 to be inclined with respect to an upper surface of the substrate 101 at opposite sides adjacent to the gate structure 160, as illustrated in a cross-section view taken in the y direction. The source/drain regions 150 may have a major width in the y direction in a region disposed adjacent to the first channel layer 141, a lowermost layer adjacent to the active region 105 among the plurality of channel layers 141, 142, and 143, for example, a region, disposed adjacent to the first channel layer 141 in the direction, having a height corresponding to a height of the first channel layer 141. The source/drain regions 150 may have relatively decreased widths in regions disposed adjacent to the overlying first and second channel layers 142 and 143, for example, regions, disposed adjacent to the second and third channel layers 142 and 143, each having a height corresponding to a height at which the second and third channel layers 142 and 143 are disposed. In the source/drain regions 150, an inclined surface, extending from the sidewall of the active region 105, may be a facet provided along a crystal plane, for example, a <111> facet. Shapes of the source/drain regions 150 will be described in further detail later with reference to FIGS. 3A to 5.

The source/drain regions 150 may be formed of a semiconductor material. For example, the source/drain regions 150 may include at least one of silicon germanium (SiGe), silicon (Si), silicon arsenic (SiAs), silicon phosphide (SiP), and silicon carbide (SiC). Specifically, the source/drain regions 150 may be formed of an epitaxial layer. For example, the source/drain regions 150 may include n-type doped silicon (Si) and/or p-type doped silicon germanium (SiGe). In example embodiments, the source/drain regions 150 may include a plurality of regions including elements having different concentrations, and/or doping elements. In addition, in example embodiments, the source/drain regions 150 are connected to each other on two or more active regions 105 disposed adjacent to each other, or may be merged to form a single source/drain region 150.

The gate structure 160 may be disposed to intersect the active regions 105 and the channel structures 140 above the active regions 105 and the channel structures 140 to extend in one direction, for example, the y direction. Channel region of transistors may be formed in the active regions 105 and the channel structures 140 intersecting the gate structure 160. The gate structure 160 includes a gate electrode 165, a gate dielectric layer 162 between the gate electrode 165 and the plurality of channel layers 141, 142, and 143, spacer layers 164 on side surfaces of the gate electrode 165, and a gate capping layer 166 on a top surface of the gate electrode 165.

The gate dielectric layer 162 may be disposed between the active region 105 and the gate electrode 165 and between the channel structure 140 and the gate electrode 165, and may be disposed to cover at least a portion of a surface of the gate electrode 165. For example, the gate dielectric layer 162 may be disposed to surround all surfaces except for an uppermost surface of the gate electrode 165. The gate dielectric layer 162 may extend between the gate electrode 165 and the spacer layers 164, but extension of the gate dielectric layer 162 is not limited thereto. The gate dielectric layer 162 may include an oxide, a nitride, or a high-k material. The high-k material may refer to a dielectric material having a dielectric constant higher than a dielectric constant of silicon oxide ($SiO_2$). The high-k material may include one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed over the active region 105 to extend to an upper portion of the channel structure 140 while filling spaces between the plurality of channel layers 141, 142, and 143. The gate electrode 165 may be spaced apart from the plurality of channel layers 141, 142, and 143 by the gate dielectric layer 162. The gate electrode 165 may include a conductive material, and may include a metal nitride such as titanium nitride (TiN), tantalum nitride (TaN), or a tungsten nitride (WN), and/or a metal material such as aluminum (Al), tungsten (W), or molybdenum (Mo), or a semiconductor material such as doped polysilicon. The gate electrode 165 may have a multilayer structure including two or more layers. The gate electrode 165 may be divided between at least some of adjacent transistors by an additional division portion, depending on the configuration of the semiconductor device 100.

The spacer layers 164 may be disposed on both side surfaces of the gate electrode 165 on the channel structure 140. The spacer layers 164 may insulate the source/drain regions 150 and the gate electrodes 165 from each other, together with internal spacer layers 130. In some embodiments, the spacer layers 164 may have a multilayer structure. The spacer layers 164 may include an oxide, a nitride, and oxynitrides. Specifically, the spacer layers 164 may include a low-k dielectric layer. Active spacer layers 164F may be formed simultaneously in the same process as the spacer layers 164, and thus, may include the same material as the spacer layers 164. The active spacer layers 164F may be disposed on the upper sidewalls of the active regions 105 exposed by the isolation layers 110 at opposite sides adjacent to the gate structure 160.

The gate capping layer 166 may be disposed on an uppermost surface of the gate electrode 165, and a lower surface and side surfaces thereof may be surrounded by the gate electrode 165 and the spacer layers 164, respectively. The gate capping layer 166 may include an oxides, a nitrides, and an oxynitride.

The internal spacer layers 130 may be disposed parallel to the gate electrode 165 between spaces of the channel structure 140. Below the third channel layer 143, the gate electrode 165 may be spaced apart from the source/drain regions 150 by the internal spacer layers 130 to be electrically insulated from the source/drain regions 150. The internal spacer layers 130 may have a shape in which a side surface, facing the gate electrode 165, is convexly rounded inwardly toward the gate electrode 165, but a shape of the internal spacer layers is not limited thereto. The internal spacer layers 130 may include an oxide, a nitride, and an oxynitride. Specifically, the internal spacer layers 130 may include a low-k dielectric layer. In some embodiments, the internal spacer layers 130 may be omitted. In this case, the gate electrode 165 may be disposed to extend between the spaces of the channel structure 140, and a side surface of the gate electrode 165 along the x direction may be disposed to be vertically parallel to a side surface of the channel structure 140.

The interlayer insulation layer 190 may be disposed to cover top surfaces of the source/drain regions 150, the gate structures 160, and the isolation layers 110. The interlayer insulation layer 190 may include at least one of, for example, an oxide, a nitride, and an oxynitride, and may include a low-k dielectric material.

The contact plug 180 may be connected to the source/drain region 150 to apply an electrical signal to the source/drain region 150. The contact plug 180 may penetrate through the interlayer insulation layer 190 to vertically extend. The contact plug 180 may be disposed on the source/drain region 150, as illustrated in FIG. 1. In some embodiments, the contact plug 180 may be disposed to have a length greater than a length of the source/drain region 150 in the y direction. The contact plug 180 may have an inclined side surface, having a lower portion narrower than an upper portion, depending on an aspect ratio, but a shape of the contact plug 180 is not limited thereto.

The contact plug 180 may be disposed to recess the source/drain region 150 to a predetermined depth. The contact plug 180 may extend to, for example, a portion lower than the third channel layer 143. The contact plug 180 may be recessed to, for example, an upper surface of the second channel layer 142, but recessing of the contact plug 180 is not limited thereto. In example embodiments, the contact plug 180 may be disposed to be in contact with the source/drain region 150 along the top surface of the source/drain region 150 without recessing the source/drain region 150.

Figure 3A:
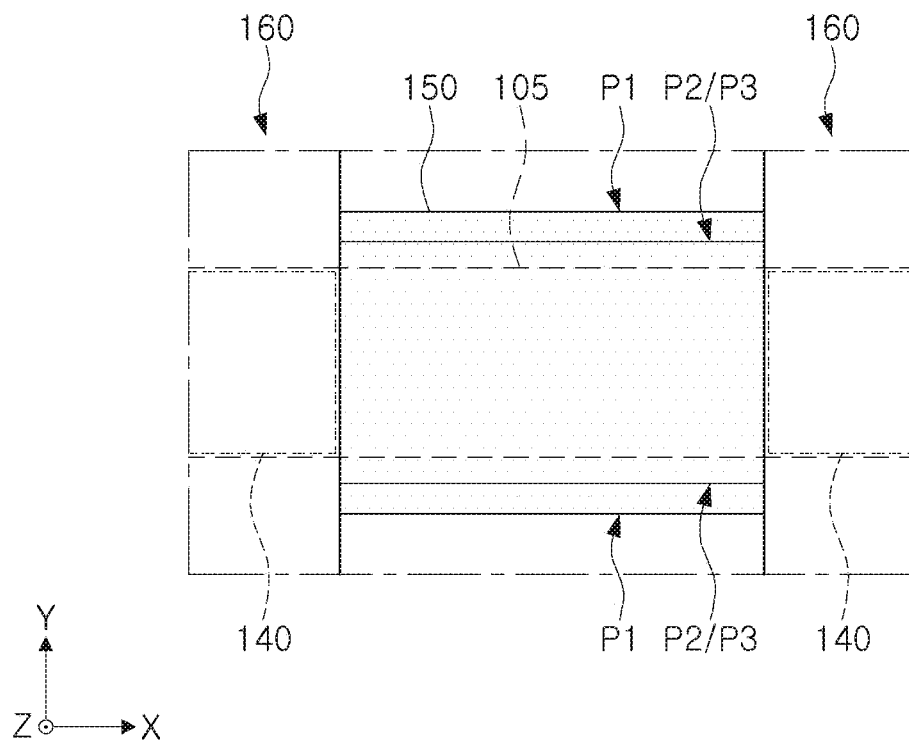
FIGS. 3A and 3B are a top view and a cross-sectional view of a semiconductor device according to example embodiments, respectively.
Figure 3B:
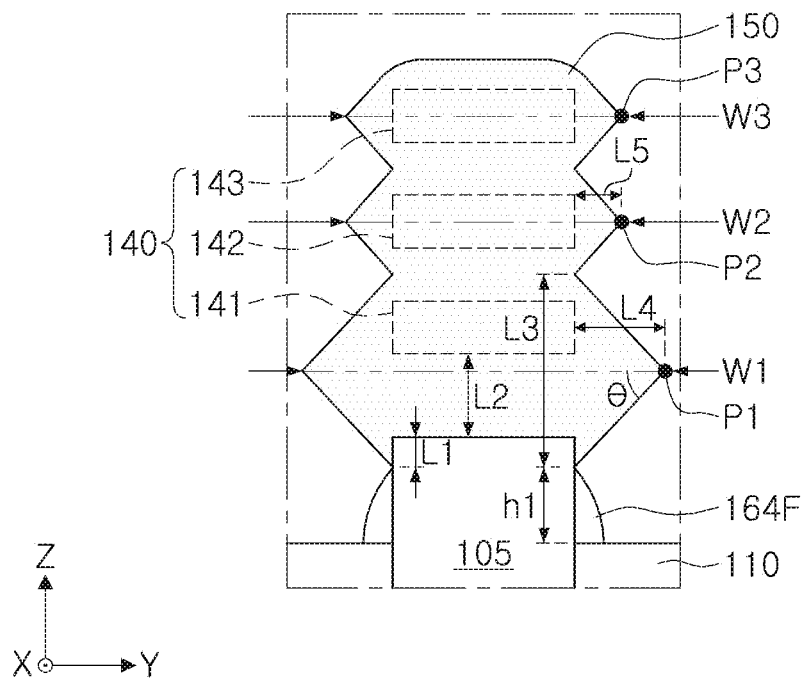

FIGS. 3A and 3B are a top view and a cross-sectional views of a semiconductor device according to example embodiments, respectively. FIGS. 3A and 3B illustrate an enlarged version of region 'A' of FIG. 1 and an enlarged version of region 'B' of FIG. 2, respectively.

Referring to FIGS. 3A and 3B, the source/drain region 150 may extend further than the active region 105, to opposite sides adjacent to the gate structure 160 in the y direction and may include a plurality of regions, each having a width greater than a width of the active region 105. The source/drain region 150 has a first region including a first point P1 having a first major width W1 from a lower portion thereof, a second region including a second point P2 having a second major width W2 less than the first major width W1, and a third region P3 having a third major width W3 less than the first major width W1. The first major width W1 of the first point P1 may be a major width of the first region in the y direction and may be a major width of the entire source/drain region 150 in the y direction. The source/drain region 150 may have a width greater than the active region 105 at least in the first to third points P1, P2, and P3, and thus, may have a curvature. The shape of the source/drain region 150 may result from the fact that a lower portion of the source/drain region 150 is grown from the sidewall of the active region 105 and an upper portion of the source/drain region 150 has regions in which growth of the source/drain region 150 is limited due to the internal spacer layers 130 described with reference to FIGS. 1 and 2.

The first point P1 may be a point in which the source/drain region 150 is grown from the top surface and the sidewalls of the active region 105 and grown from the side surface of the first channel layer 141 in the x direction to have a major width. Specifically, the source/drain region 150 may be grown from the sidewall of the active region 105 to the first point P1 while forming a facet provided along a crystal plane. Accordingly, in the source/drain region 150, a side surface extending to the first point P1 may form a specific angle θ depending on a crystal plane. For example, when forming a [111] facet, the angle θ may be about 54.7 degrees. A side surface of an upper portion of the first point P1 may also be a facet depending on a crystal plane. Accordingly, side surfaces of upper and lower portions on the basis of the first point P1 may be facets, and the source/drain region 150 may have the major width on a boundary between the facets. The first point P1 may be disposed at a height between the first channel layer 141 and the active region 105, but a detailed height may be variously changed in example embodiments. For example, the first point P1 may be disposed at a height between an upper surface of the first channel layer 141 and an upper surface of the active region 105. For example, the first point P1 may be disposed at a height between a lower surface of the first channel layer 141 and an upper surface of the active region 105. The location of the first point P1 may be controlled by a first length L1, at which the sidewall of the active region 105 is exposed by active spacer layers 164F, and a second length L2, a length between the top surface of the active region 105 and a lower surface of the first channel layer 141. The second length L2 may be controlled by a depth at which the active region 105 is recessed in the source/drain region 150 during a manufacturing process.

When a length from a point, in which the active region 105 is exposed, to a height of a middle of the first and second channel layers 141 and 142 is defined as a third length L3, a fourth length L4, at which the first point P1 protrudes from an extension line of a side surface of the first channel layer 141 or the active region 105 in the y direction, may be approximately calculated by (L3/2)/tan θ. Accordingly, the fourth length L4 may be increased as a first length L1, at which the sidewall of the active region 105 is exposed by the active spacer layers 164F, and a second length L2 between the top surface of the active region 105 and the lower surface of the first channel layer 141 are increased. In example embodiments, the fourth length L4 may range from about 7 nm to 20 nm. When a length, at which the second point P2 protrudes from an extension line of a side surface of the second channel layer 142 or the active region 105 in the y direction, is defined as a fifth length L5, the length L5 may also be calculated in a manner similar to the calculation manner of the fourth length L4. In example embodiments, a ratio of the fifth length L5 to the fourth length L4 (L5/L4) may range from about 0.4 to about 0.7. The range may be controlled by changing thicknesses and a spacing distance of the first and second channel layers 141 and 142 and the first and second lengths L1 and L2.

The second point P2 and the third point P3 may be disposed at heights corresponding to the second channel layer 142 and the third channel layer 143, respectively. As illustrated in FIG. 3A, the second point P2 and the third point P3 may be disposed in substantially the same position on a plane. For example, the second major width W2 and the third major width W3 may be substantially the same, but are not limited thereto. According to embodiments, the third major width W3 may be less than the second major width W2. In this case, the first point P1, the second point P2, and the third point P3 may be sequentially disposed from outside of the source/drain region 150 in the y direction on a plane.

The source/drain region 150 may include regions, each having a decreased width, between the first to third points P1, P2, and P3. For example, the source/drain region 150 may include regions, each having a decreased width between the first point P1 and the second point P2 and between the second point P2 and the third point P3 and regions, each having a local minimum width. The minimum width may be proximate to, for example, the width of the active region 105, but is not limited thereto. The regions, each locally having a minimum width, may be disposed at a height corresponding to, for example, a height at which the internal spacer layers 130 are disposed. Accordingly, the source/drain region 150 may have a curvature corresponding to dispositions of the plurality of channel layers 141, 142, and 143 and internal spacer layers 130, and may have a gently curved top surface above the third point P3. As illustrated in FIG. 3B, the source/drain region 150 may have an external side surface having facets in at least one region between the first to third points P1, P2, and P3.

Figure 4:
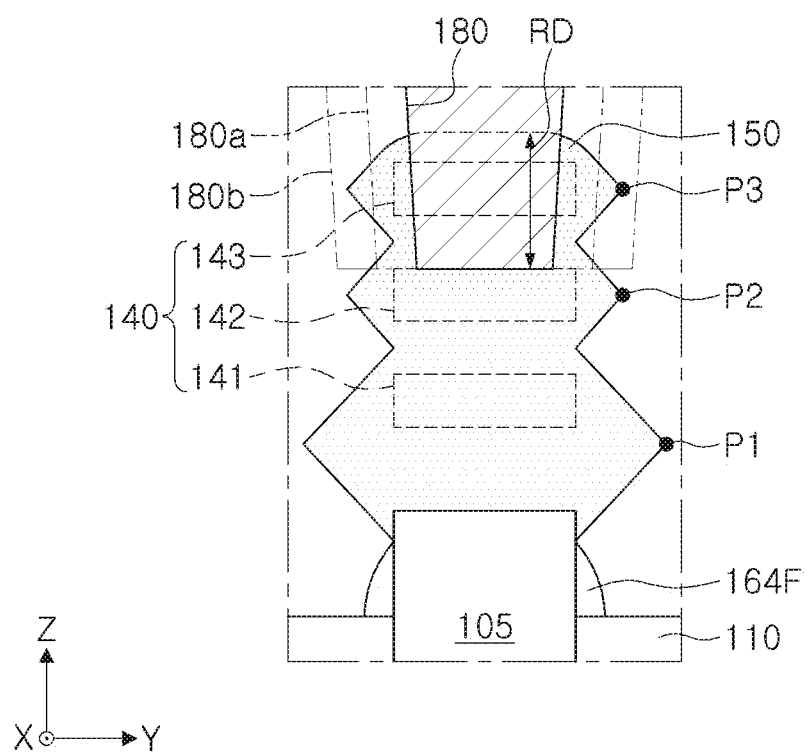
FIG. 4 is a cross-sectional view of a semiconductor device according to example embodiments.

FIG. 4 is a cross-sectional view of a semiconductor device according to example embodiments. FIG. 4 illustrates an enlarged version of a region corresponding to the region 'B' of FIG. 2.

Referring to FIG. 4, various types of contact plugs 180, 180a, and 180b according to example embodiments are illustrated together with a source/drain region 150 and a contact plug 180 to describe a disposing relationship between the source/drain region 150 and the contact plug 180.

The contact plugs 180, 180a, and 180b may be disposed to recess an upper portion of the source/drain region 150 to a predetermined depth RD from an upper surface thereof. The recessed depth RD may be a height substantially corresponding to an upper surface of a second channel layer 142. However, the recessed depth RD is not limited thereto and may be variously changed in example embodiments. A person having ordinary skill the art would know when the recessed depth RD is relatively large, the source/drain region 150 may be decreased in volume to insufficiently perform electrical functions. When the recessed depth RD is relatively small, the source/drain region 150 and the contact plugs 180, 180a, and 180b may not be electrically connected to each other due to a process variation.

The contact plugs 180, 180a, and 180b according to example embodiments may have different widths, which are sequentially increased in the y direction. Similarly to the contact plug 180b, when the contact plug 180b has a width greater than a width of the source/drain region 150 in contact with the contact plug 180b, an upper portion of the source/drain region 150 is removed at opposite sides adjacent to a gate structure 160 by the recessed depth RD. Accordingly, in an ultimate structure of a semiconductor device, a shape of the source/drain region 150 may also be different depending on widths of the contact plugs 180, 180a, and 180b.

Figure 5A:
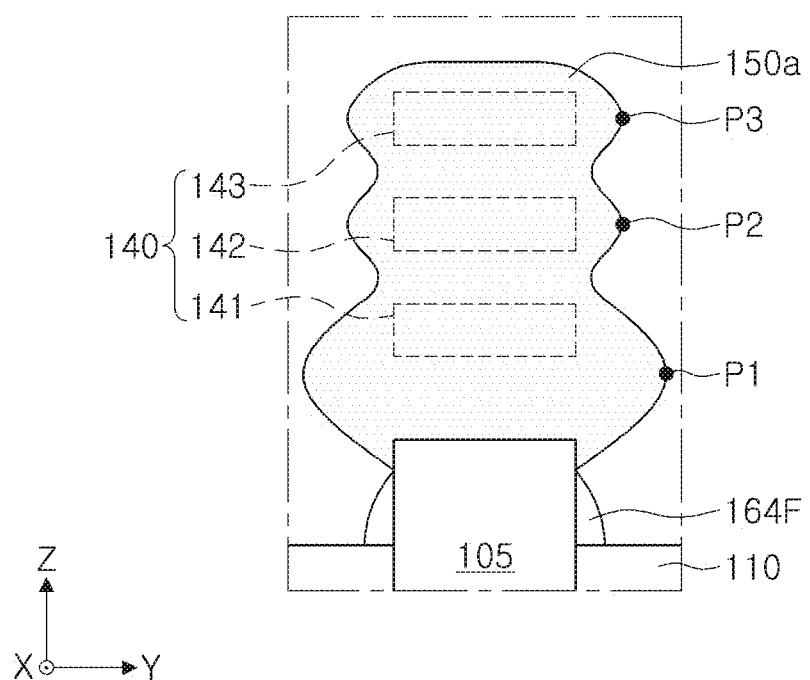
FIGS. 5A to 5C are cross-sectional views of a semiconductor device according to example embodiments.
Figure 5B:
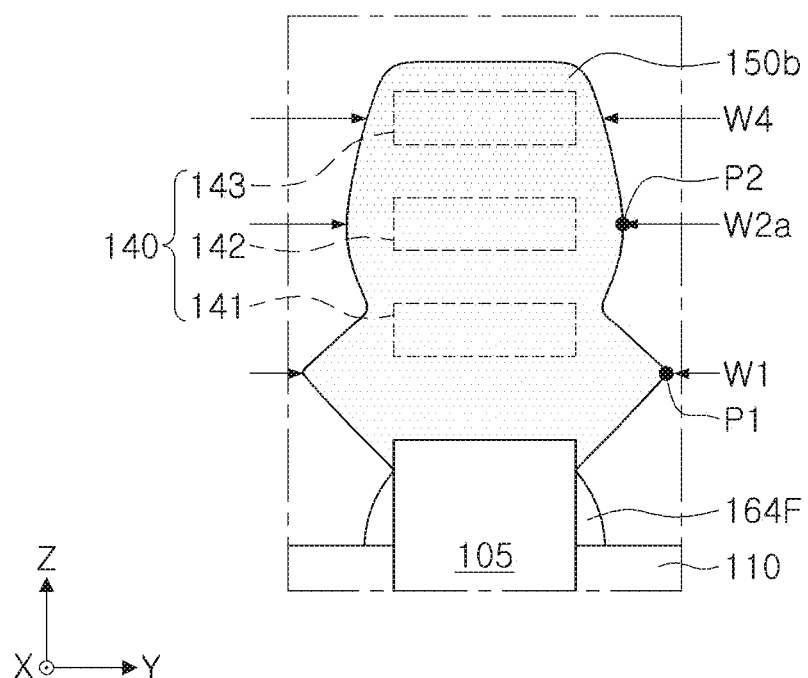
Figure 5C:
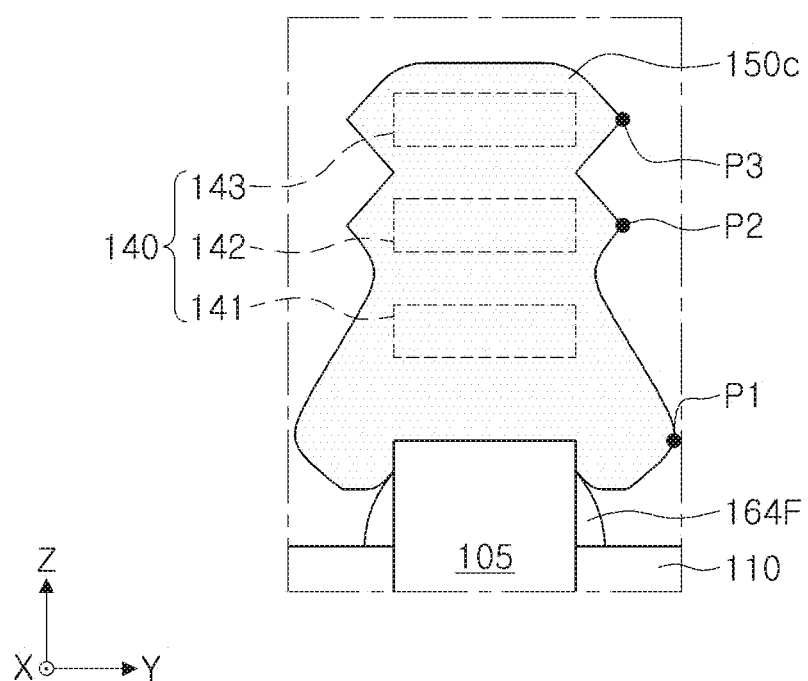

FIGS. 5A to 5C are cross-sectional views of a semiconductor device according to example embodiments. FIGS. 5A to 5C illustrate enlarged versions of a region corresponding to the region 'B' of FIG. 2, respectively.

Referring to FIG. 5A, a source/drain region 150a may have a shape in which facets are generally alleviated while including first to third points P1, P2, and P3, each having a locally large width, and including the first point P1 having a major width, as illustrated in FIG. 3A. For example, the source/drain region 150a may have a curvature corresponding to a plurality of channel layers 141, 142, and 143. Such a shape may be controlled depending on a material of the source/drain region 150a. For example, when the source/drain region 150a includes impurities occupying an interstitial site, the source/drain region 150a may be grown to have such a curved external surface. In this case, the source/drain region 150a may be formed of, for example, silicon phosphide (SiP).

Referring to FIG. 5B, a source/drain region 150b may have a box-shaped upper portion which does not include a third point P3 while including first and points P1 and P2, each having a locally large width, and including the first point P1 having a major width, as illustrated in FIG. 3A. The source/drain region 150b may have a fourth width W4, smaller than a first width W1 of the first point P1, at a height corresponding to a third channel layer 143. The fourth width W4 may be smaller than a second width W2a of the second point P2, or may be similar to the second width W2a. Even in this case, the source/drain region 150b may have an inclined surface up to the first point P1 having a major width.

Referring to FIG. 5C, a source/drain region 150c may be disposed such that a portion of the source/drain region 150c is grown onto active spacer layers 164F from a lower end thereof to contact the active spacer layers 164F. Accordingly, the source/drain region 150c may have a shape, in which a surface extending from a sidewall of an active region 105 to a first point P1 includes a plurality of surfaces or curved surfaces rather than a single facet, while including the first point P1 having a major width. Such a shape of the source/drain region 150c may appear when a lower end portion thereof is not grown along a crystal plane under growth conditions of the source/drain region 150c. An upper portion of the source/drain region 150c is provided with second and third points P2 and P3, each having a locally large width, but the source/drain region 150c may have a box shape, as illustrated in FIG. 5B, in some embodiments.

Figure 6:
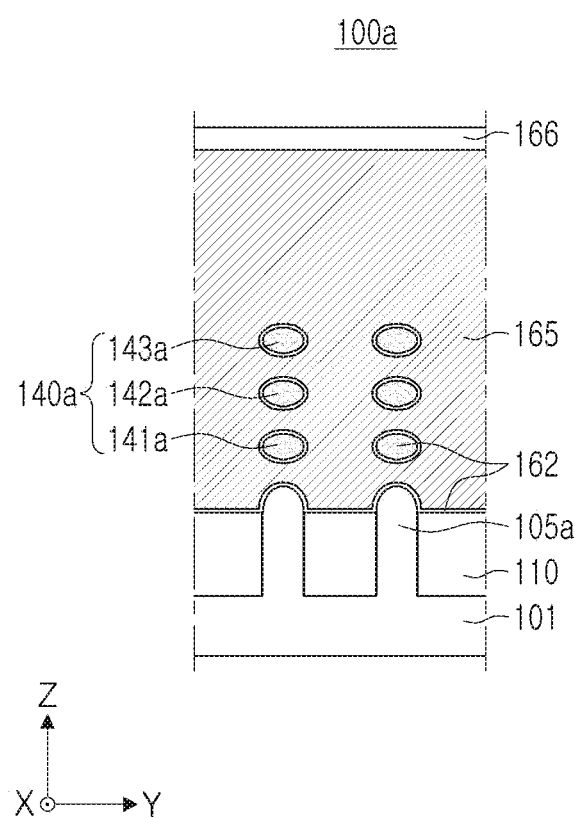
FIG. 6 is a cross-sectional view of a semiconductor device according to example embodiments.

FIG. 6 is a cross-sectional view of a semiconductor device according to example embodiments. FIG. 6 illustrates a region corresponding to a cross section taken along line II-IT of FIG. 1.

Referring to FIG. 6, a semiconductor device 100a may include an active region 105a and a channel structure 140a having widths different from those in the example embodiment of FIG. 2. The active region 105a and the channel structure 140a may have relatively smaller widths, such that a plurality of channel layers 141a, 142a, and 143a of the channel structure 140a may each have a circular shape or an elliptical shape, in which a difference between lengths of a major axis and a minor axis is relatively small, on a cross section in a y direction. For example, in the example embodiment of FIG. 2, each of the plurality of channel layers 141, 142, and 143 may have a width of about 20 nm to 50 nm in the y direction and, in this embodiment, each of the plurality of channel layers 141a, 142a, and 143a may have a width of about 3 nm to 12 nm in the y direction. As described above, in example embodiments, widths and shapes of the active region 105a and the channel structure 140a may be variously changed.

FIGS. 7A to 7J are cross-sectional views illustrating a method of manufacturing a semiconductor device according to example embodiments. In FIGS. 7A to 7J, an example embodiment of a method of manufacturing the semiconductor device of FIGS. 1 and 2 will be described and cross sections corresponding to FIG. 2 are illustrated.

Figure 7A:
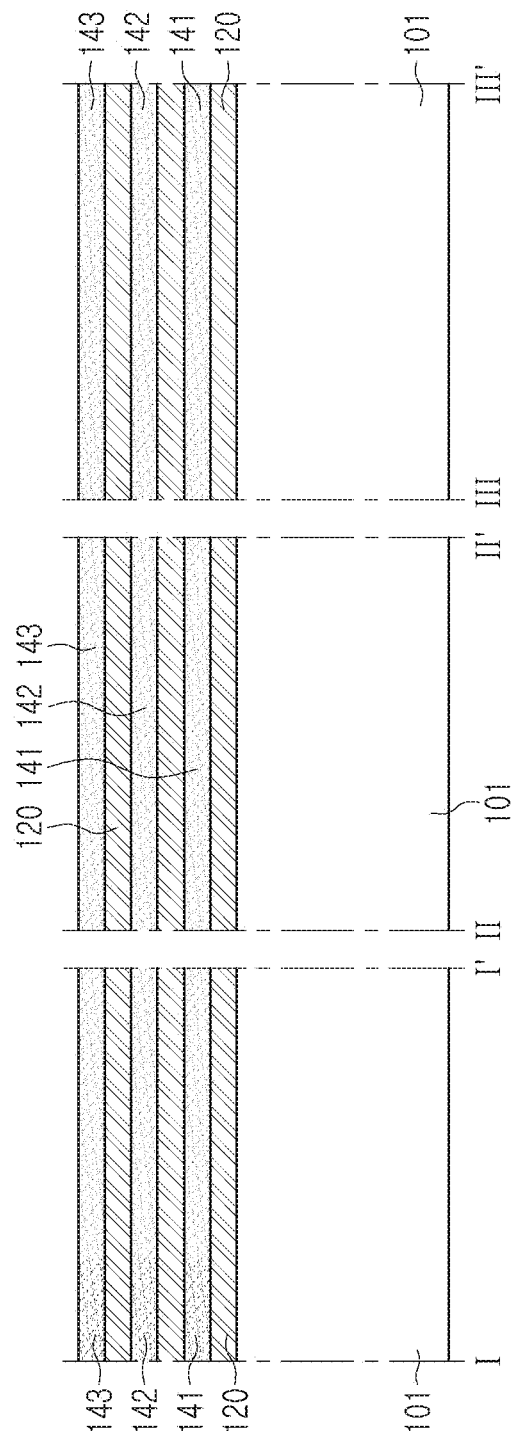
FIGS. 7A to 7J are cross-sectional views illustrating a method of manufacturing a semiconductor device according to example embodiments.

Referring to FIG. 7A, sacrificial layers 120 and channel layers 141, 142, and 143 may be alternately stacked on a substrate 101.

The sacrificial layers 120 may be layers replaced with a gate dielectric layer 162 and a gate electrode 165 in a subsequent process, as illustrated in FIG. 2. The sacrificial layers 120 may be formed of a material having an etching selectivity with respect to the channel layers 141, 142, and 143. The channel layers 141, 142, and 143 may include a material different from a material of the sacrificial layers 120. The sacrificial layers 120 and channel layers 141,142 and 143 include a semiconductor material including at least one of silicon (Si), silicon germanium (SiGe), and germanium (Ge) and may include different materials. The sacrificial layers 120 and channel layers 141,142 and 143 may or may not include impurities. For example, the sacrificial layers 120 may include silicon germanium (SiGe), and the channel layers 141, 142 and 143 may include silicon (Si).

The sacrificial layers 120 and the channel layers 141, 142, and 143 may be formed by performing an epitaxial growth process using the substrate 101 as a seed. Each of the sacrificial layers 120 and channel layers 141, 142, and 143 may have a thickness ranging from about 1 Å to 100 nm. The number of the channel layers 141, 142, and 143, stacked alternately with the sacrificial layer 120, may be variously changed in example embodiments.

Figure 7B:
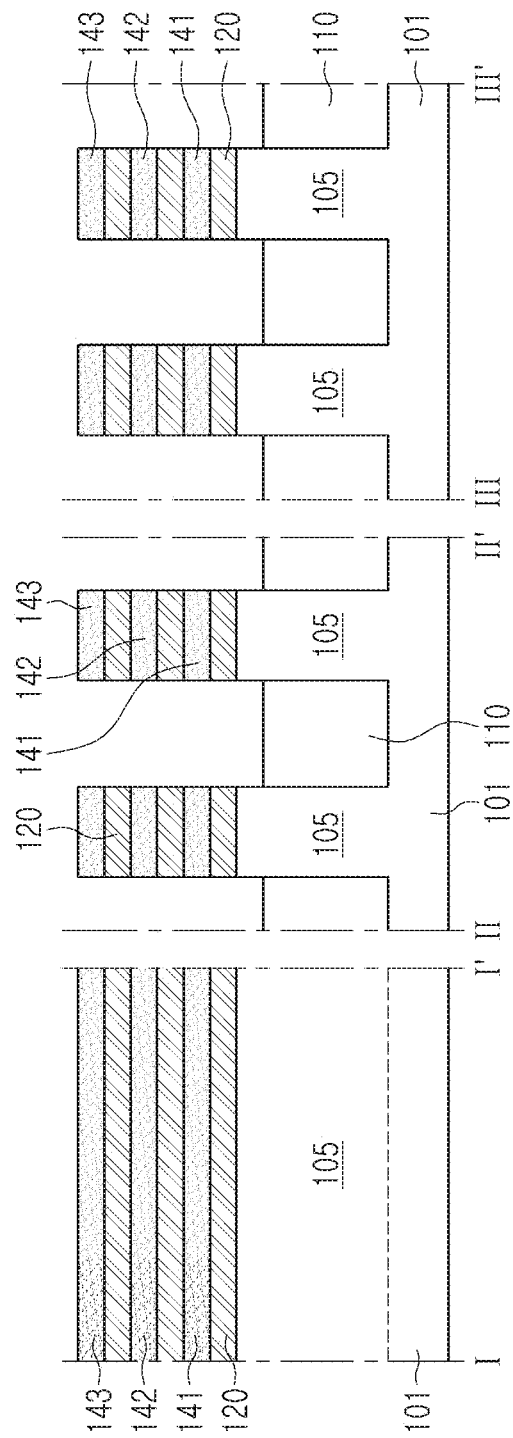

Referring to FIG. 7B, a stacked structure of the sacrificial layers 120 and the channel layers 141, 142, and 143 and a portion of the substrate 101 may be removed to form active structures.

The active structure may include sacrificial layers 120 and channel layers 141, 142, and 143 alternately stacked with each other. The active structure may further include active regions 105 formed by removing a portion of the substrate 101 to protrude to an upper surfaced of the substrate 101. The active structures may be formed in a linear shape extending in one direction, for example, the x direction in FIG. 1, and may be spaced apart from each other in the y direction.

In a region in which a portion of the substrate 101 is removed, isolation layers 110 may be formed by filling the region with an insulating material and recessing the insulating material such that the active regions 105 protrude. Top surfaces of the isolation layers 110 may be formed to be lower than top surface of the active regions 105.

Figure 7C:
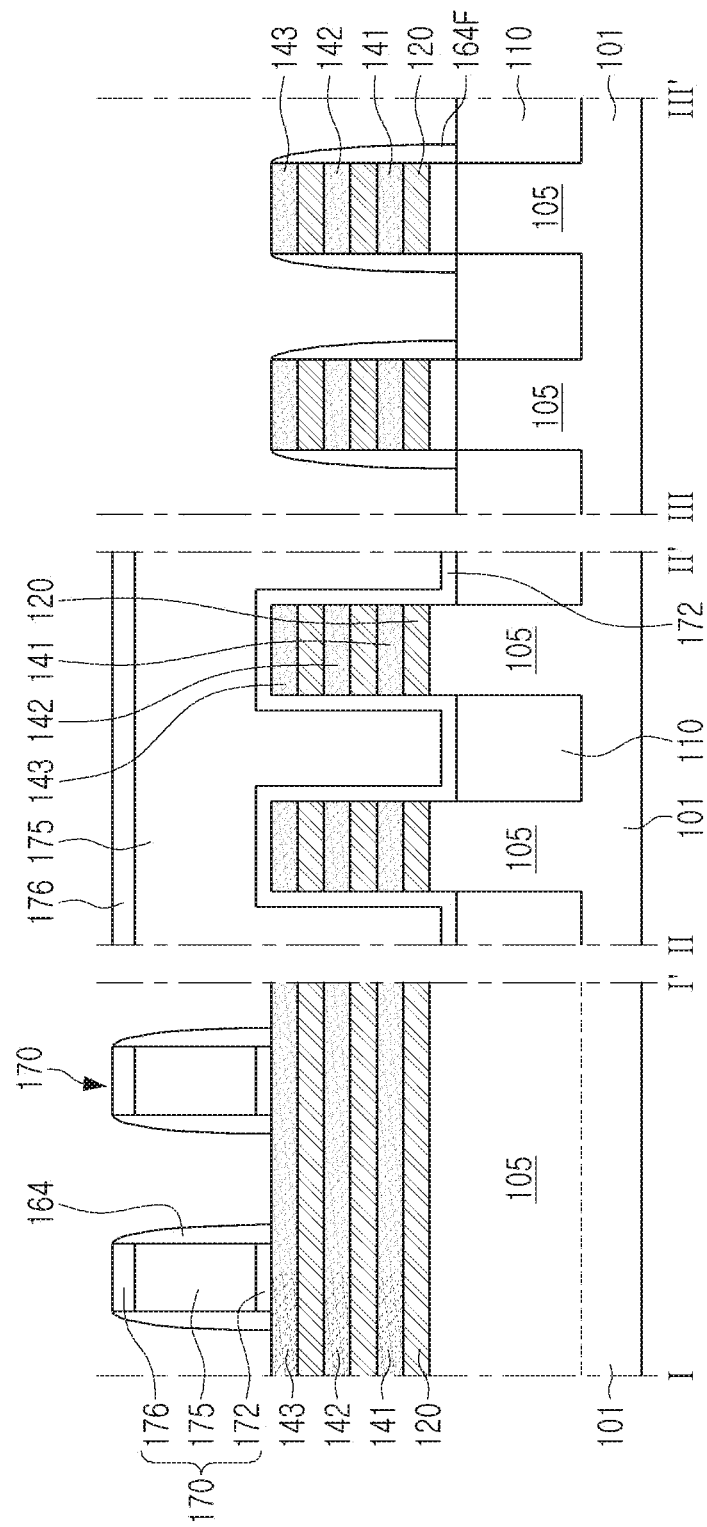

Referring to FIG. 7C, sacrificial gate structures 170 and spacer layers 164 may be formed on the active structures.

Each of the sacrificial gate structures 170 may be a sacrificial structure formed in a region, in which a gate dielectric layer 162 and a gate electrode 165 are disposed above the channel structures 140, in a substrate process, as illustrated in FIG. 2. The sacrificial gate structure 170 may include first and second sacrificial gate layers 172 and 175, and a mask pattern layer 176, which are sequentially stacked. The first and second sacrificial gate layers 172 and 175 may be patterned using a mask pattern layer 176. The first and second sacrificial gate layers 172 and 175 may be respectively an insulating layer and a conductive layer, but are not limited thereto. The first and second sacrificial gate layers 172 and 175 may be provided as a single layer. For example, the first sacrificial gate layer 172 may include a silicon oxide and the second sacrificial gate layer 175 may include polysilicon. The mask pattern layer 176 may include a silicon oxide and/or a silicon nitride. The sacrificial gate structures 170 may have a linear shape extending in one direction while intersecting the active structures. The sacrificial gate structures 170 may extend, for example, in the y direction of FIG. 1 and be spaced apart from each other in the x direction.

The spacer layers 164 may be formed on both sidewalls of the sacrificial gate structures 170. With the spacer layers 164, active spacer layers 164F may also be formed on both sidewalls of the active structures exposed from the sacrificial gate structures 170. The spacer layers 164 and the active spacer layers 164F may be formed by forming a layer having a uniform thickness along top and side surfaces of the sacrificial gate structures 170 and the active structures and anisotropically etching the layer having a uniform thickness. The spacer layers 164 and the active spacer layers 164F may be formed of the same material. The spacer layers 164 and the active spacer layers 164F may be formed of a low-k dielectric material and may include at least one of, for example, SiO, SiN, SiCN, SiOC, SiON, and SiOCN.

Figure 7D:
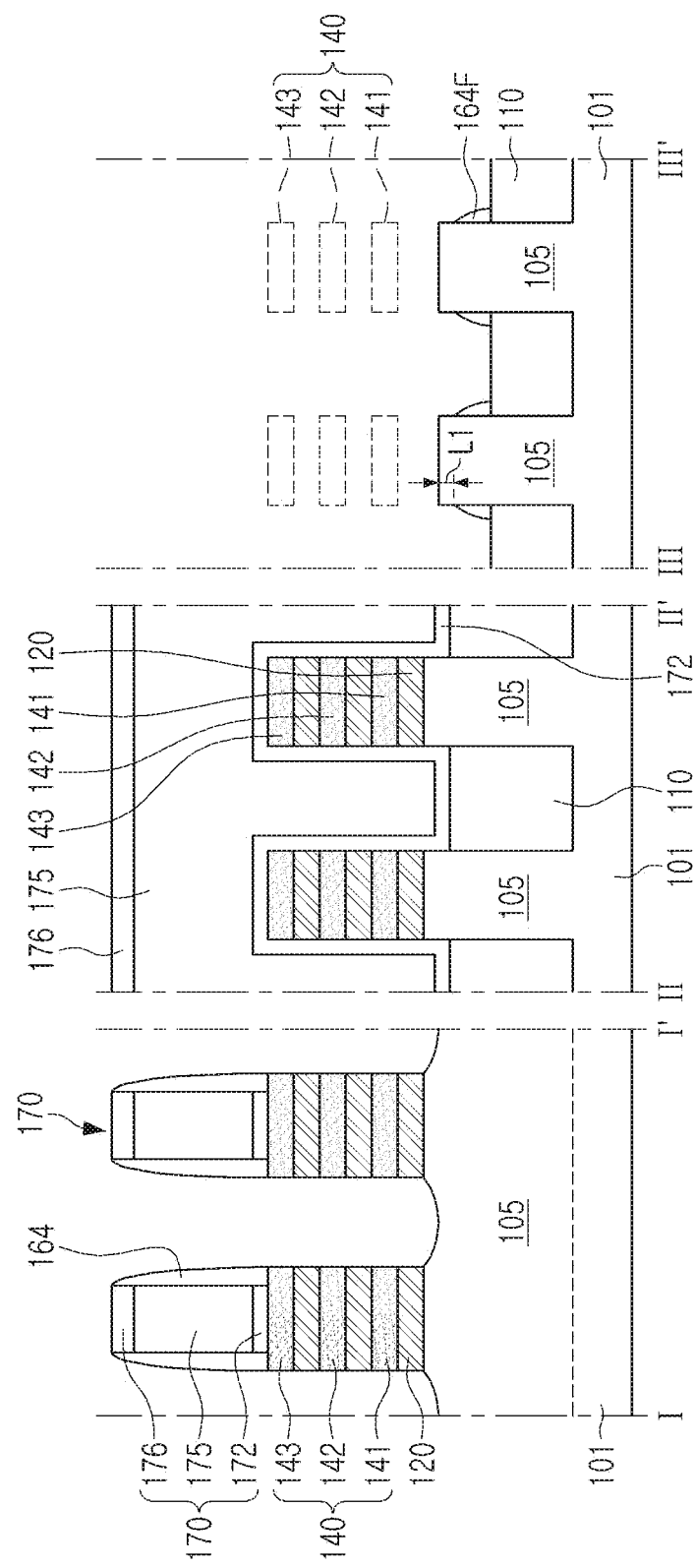

Referring to FIG. 7D, the sacrificial layers 120 and channel layers 141, 142, and 143 exposed between sacrificial gate structures 170 may be removed to form channel structures 140.

The exposed sacrificial layers 120 and the exposed channel layers 141, 142, and 143 may be removed using the sacrificial gate structures 170 and spacer layers 164 as masks. Accordingly, the channel layers 141, 142, and 143 each may have a limited length in the x direction and constitute the channel structure 140. In example embodiments, portions of the sacrificial layers 120 and a portion of the channel structure 140 may be removed from side surfaces thereof below the sacrificial gate structures 170, such that both sides thereof may be disposed below the sacrificial gate structures 170 and the spacer layers 164.

In this process, portions of the active regions 105 may also be recessed and removed from top surfaces thereof. In addition, portions of the active spacer layers 164F, disposed on both sidewalls of the active structures, are removed while the sacrificial layers 120 and channel layers 141, 142, and 143 are removed, and portions thereof may be further removed during a process of recessing the active regions 105.

The active spacer layers 164F are controlled to remain by changing conditions of the processes such that upper sidewalls of the active regions 105 are exposed by a predetermined length L1, as illustrated in the drawing. According to embodiments, the length L1 may be varied within a range of exposing the upper sidewalls of the active regions 105. According to embodiments, in this process, portions of the spacer layers 164 on both sidewalls of the sacrificial gate structures 170 may also be removed from upper portions thereof to a predetermined depth. In example embodiments, the active spacer layers 164F may be removed through an additional process to be formed in such a manner.

Figure 7E:
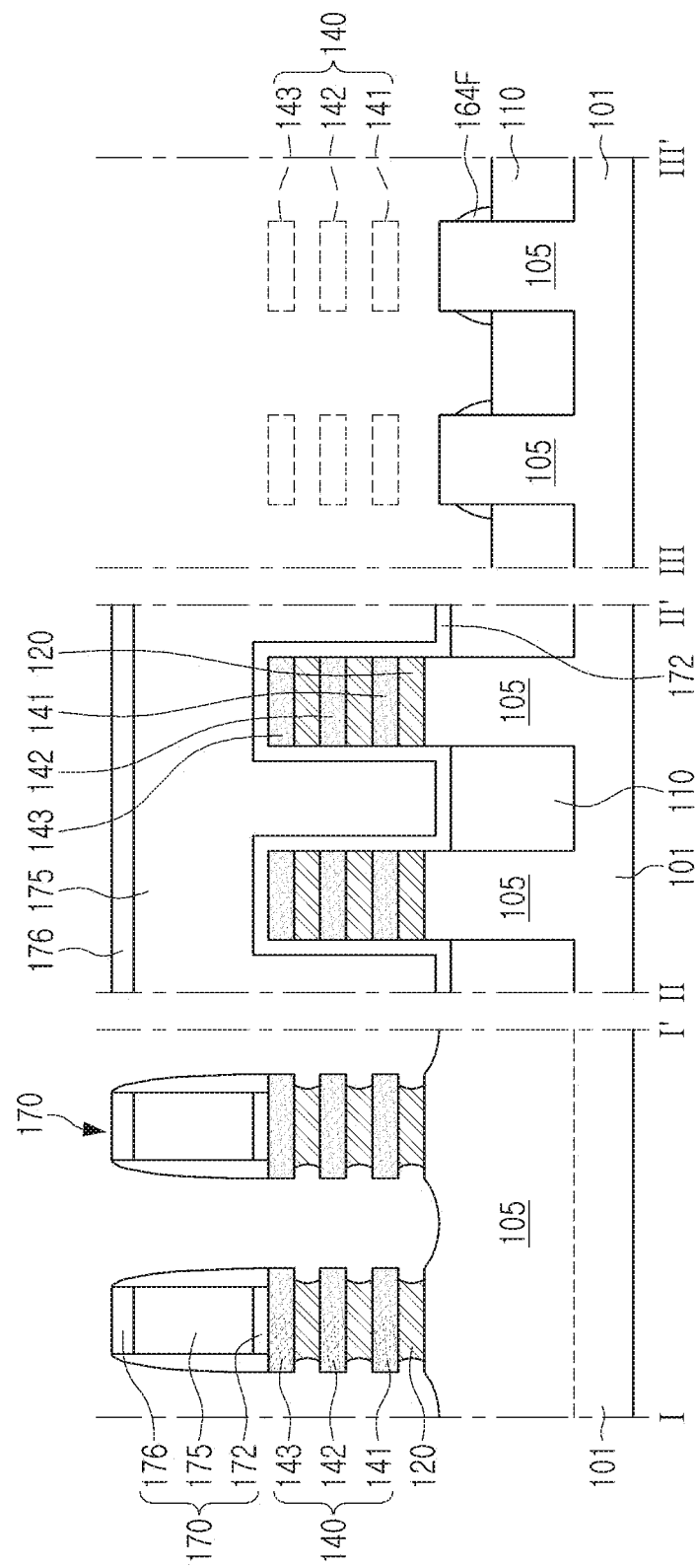

Referring to FIG. 7E, portions of the exposed sacrificial layers 120 may be removed from side surfaces thereof.

The sacrificial layers 120 may be etched selectively with respect to the channel structures 140 by, for example, a wet etching process, to be removed from the side surfaces thereof to a predetermined depth in the x-direction. The sacrificial layers 120 may have inwardly recessed side surfaces due to such side etching. However, shapes of the side surfaces of the sacrificial layers 120 are not limited to those illustrated in the drawing.

Figure 7F:
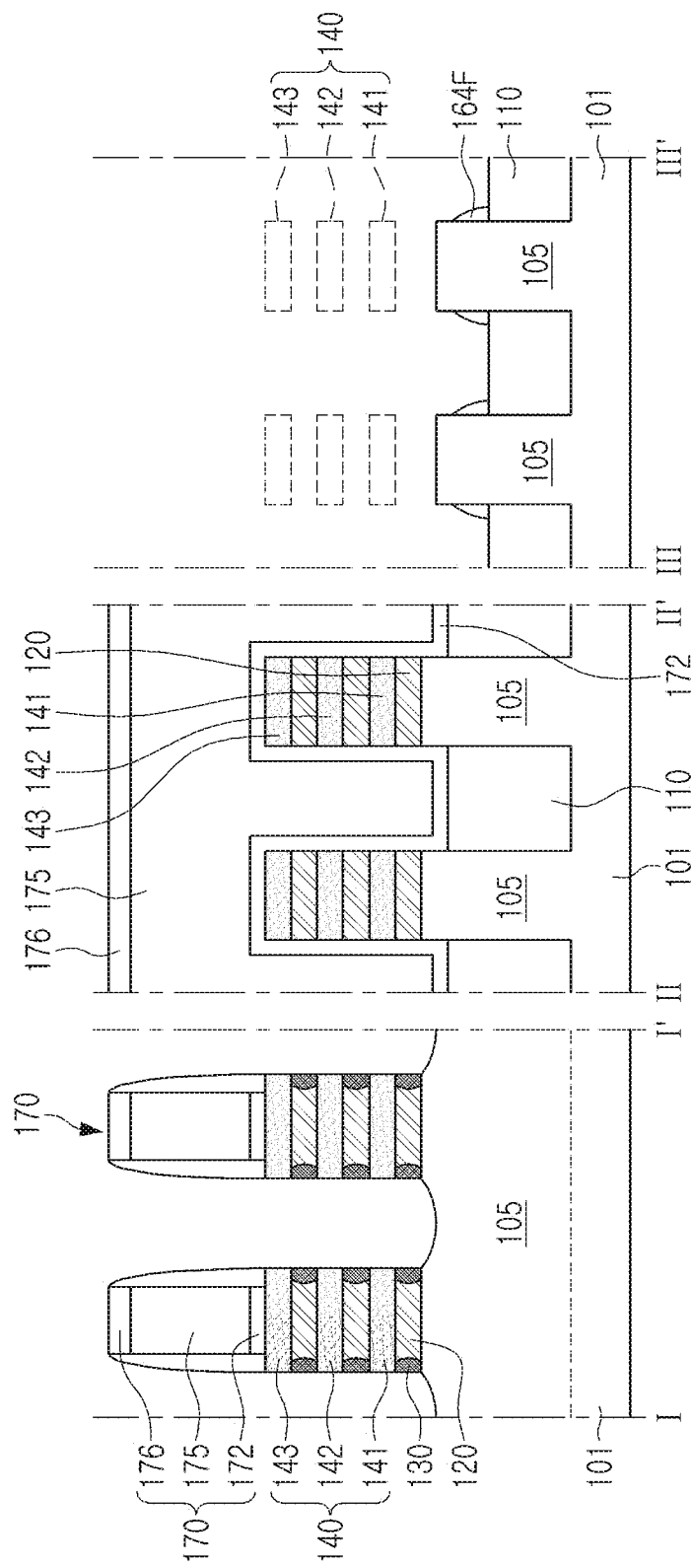

Referring to FIG. 7F, internal spacer layers 130 may be formed in regions in which the sacrificial layers 120 are removed.

The internal spacer layers 130 may be formed by filling the regions, in which the sacrificial layers 120 are removed, with an insulating material and removing the insulating material deposited on outside of the channel structures 140. The internal spacer layers 130 may be formed of the same material as the spacer layers 164, but a material of the internal spacer layers 130 is not limited thereto. For example, the internal spacer layers 130 may include at least one of SiN, SiCN, SiOCN, SiBCN, and SiBN.

When the active spacer layers 164F are formed to be higher than the upper sidewalls of the active regions 105, rather than being formed to expose the upper sidewall of the active regions 105 in the above process referring to FIG. 7D, a material of the internal spacer layers 130 may remain between the active spacer layers 164F and the active region 105 in this process. In this case, growth of the source/drain regions 150 may be hampered and the volume of the source/drain regions 150 may be decreased in a subsequent process to degrade electrical characteristics of the semiconductor device. However, according to example embodiments, since the active spacer layers 164F are formed to expose the upper sidewalls of the active regions 105, the material of the internal spacer layers 130 does not remain in regions, in which the source/drain regions 150 are to be formed, in this process. Therefore, the growth of the source/drain regions 150 may not be hampered.

Figure 7G:
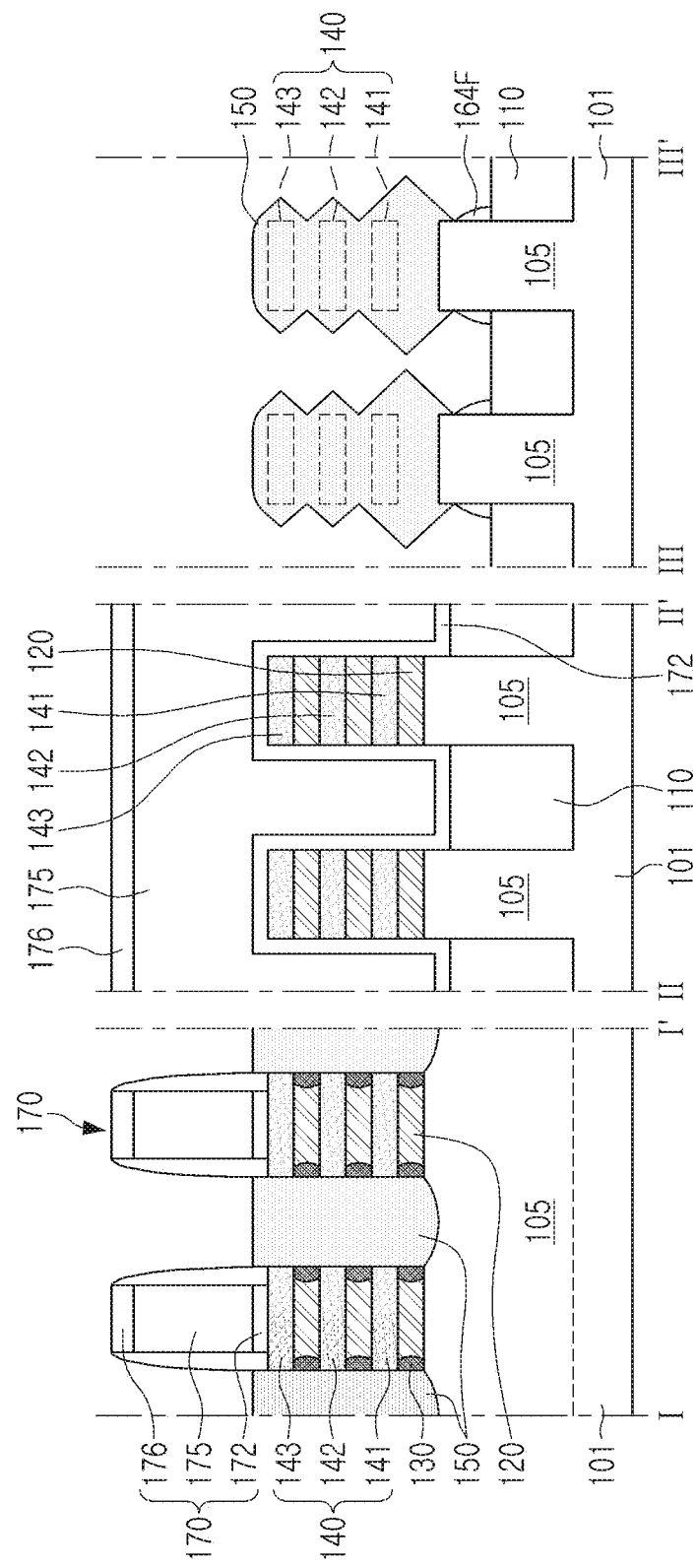

Referring to FIG. 7G, source/drain regions 150 may be formed on active regions 105 at opposite sides adjacent to the sacrificial gate structures 170.

The source/drain regions 150 may be formed by performing a selective epitaxial growth process using the active regions 105 and the channel structures 140 as seeds. The source/drain regions 150 may be connected to the channel layers 141, 142, and 143 of the channel structures 140 through side surfaces thereof and may be in contact with the internal spacer layers 130 between the channel layers 141, 142, and 143.

Since the source/drain regions 150 are grown from the sidewalls of the active regions 105 on a cross section in a y direction, each of the source/drain regions 150 may be grown with a facet provided along a crystal plane in an epitaxial growth process. For example, the source/drain regions 150 may be grown to form a side surface inclined with respect to an upper surface of the active regions 105 while being grown on a (100) plane, the top surface of the active regions 105, at a relatively high speed in a direction perpendicular to the top surface. Thus, the source/drain regions 150 may include a region having a major width, disposed between the source/drain regions 150 and the first channel layer 141. The source/drain regions 150 may include impurities doped during the growth process or after the growth process.

Figure 7H:
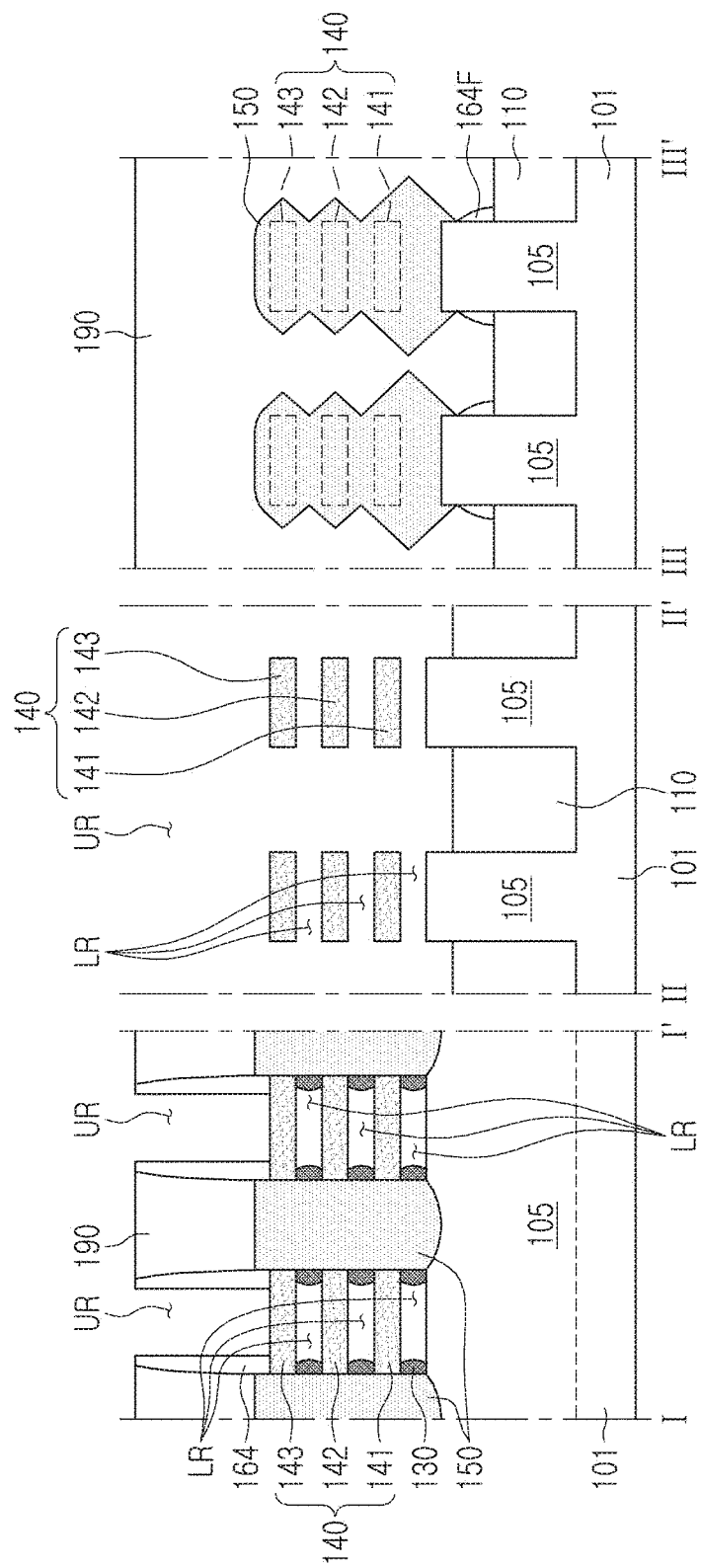

Referring to FIG. 7H, an interlayer insulation layer 190 may be formed, and the sacrificial layers 120 and the sacrificial gate structures 170 may be removed.

The interlayer insulation layer 190 may be formed by forming an insulating layer to cover the sacrificial gate structures 170 and the source/drain regions 150 and performing a planarization process.

The sacrificial layers 120 and the sacrificial gate structures 170 may be selectively removed with respect to the spacer layers 164, the interlayer insulation layer 190, and the channel structures 140. After the sacrificial gate structures 170 are removed to form upper gap regions UR, the sacrificial layers 120, exposed through the upper gap regions UR, may be removed to form lower gap regions LR. For example, when the sacrificial layers 120 includes silicon germanium (SiGe) and the channel structures 140 includes silicon (Si), the sacrificial layers 120 may be selectively removed by performing a wet etching process using a peracetic acid as an etchant. During the removal process, the source/drain regions 150 may be protected by an interlayer insulation layer 190 and the internal spacer layers 130.

Figure 7I:
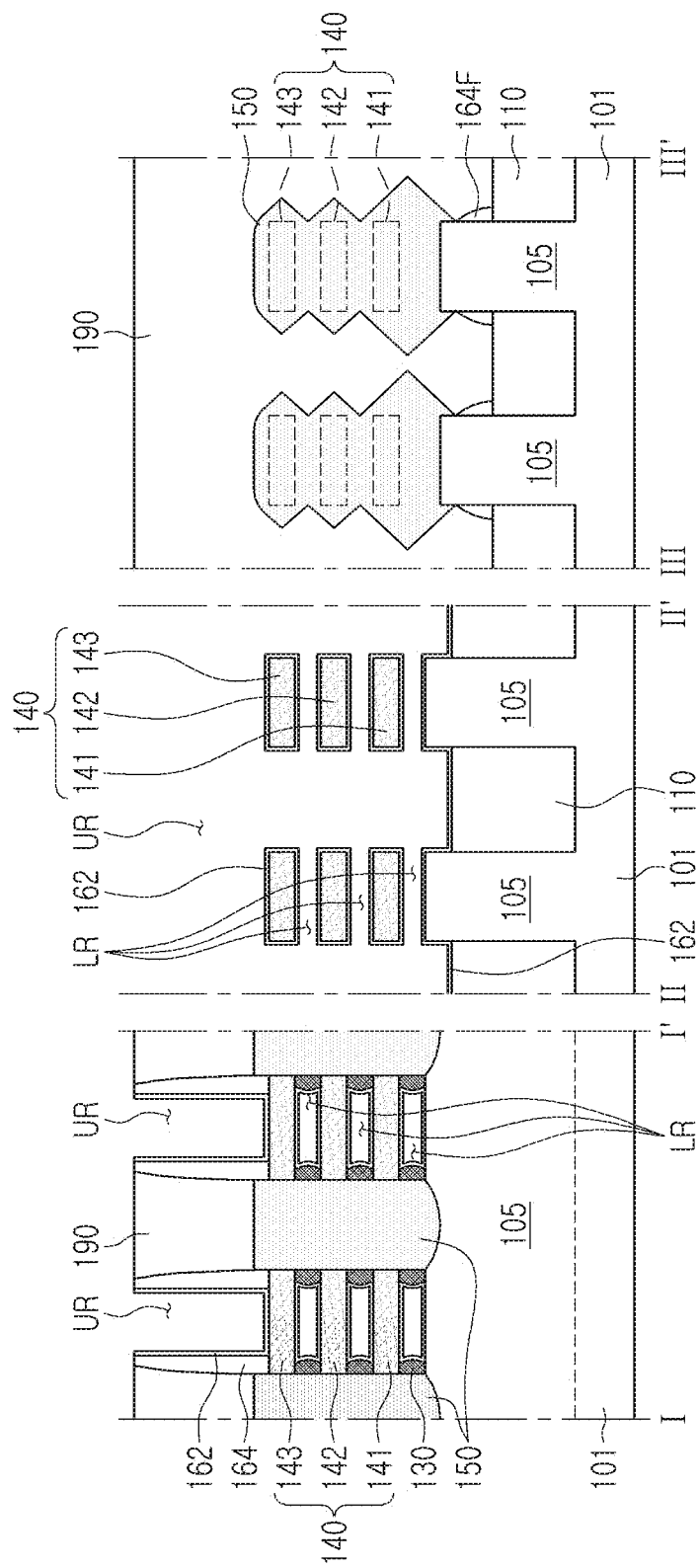

Referring to FIG. 7I, gate dielectric layers 162 may be formed in the upper gap regions UR and the lower gap regions LR.

The gate dielectric layers 162 may be formed to conformally cover internal surfaces of the upper gap regions UR and the lower gap regions LR.

Figure 7J:
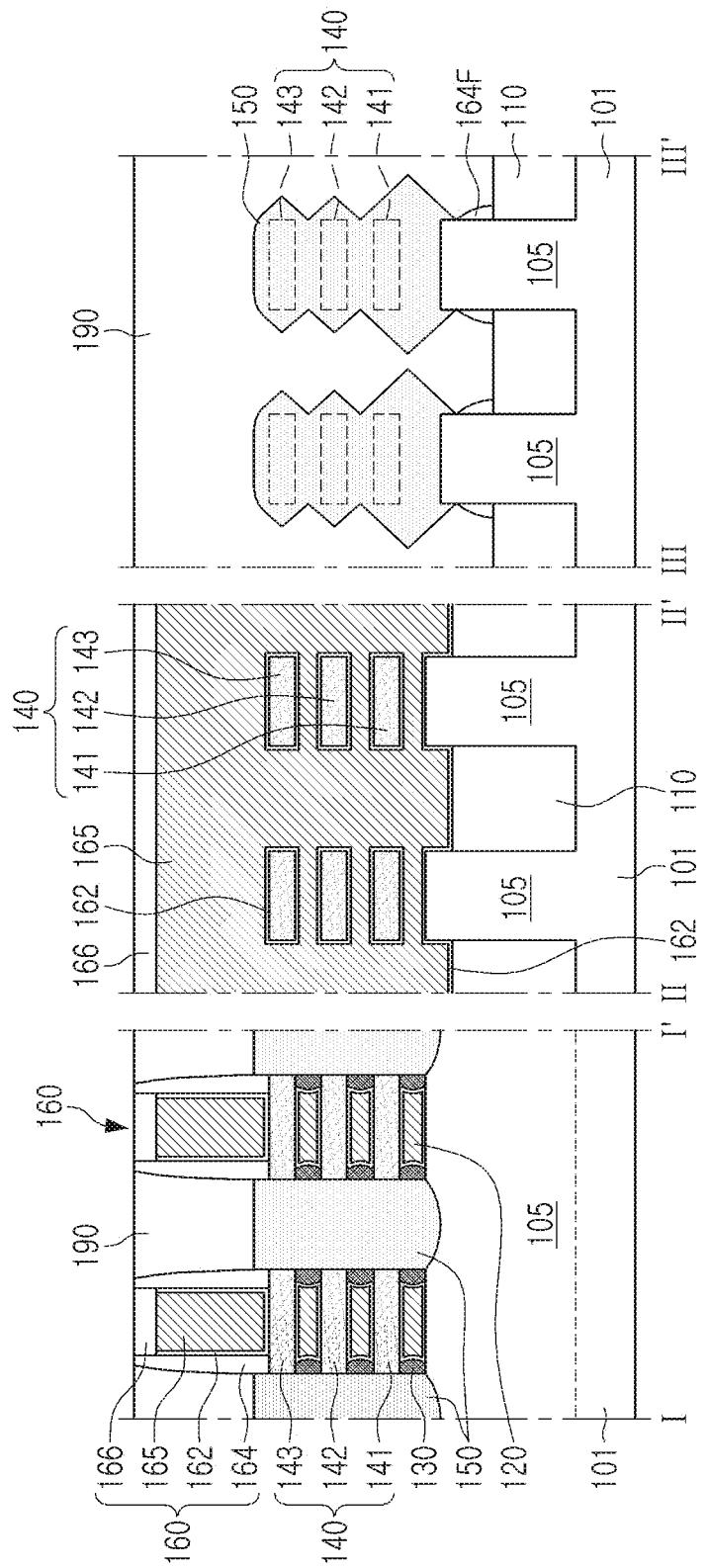

Referring to FIG. 7J, gate electrodes 165 may be formed to fill the upper and lower gap regions UR and LR, and a gate capping layer 166 may be formed on the gate electrodes 165.

After the gate electrodes 165 are formed to completely fill the upper gap regions UR and the lower gap regions LR, they may be removed from upper portion thereof in the upper gap regions UR to a predetermined depth. The gate capping layer 166 may be formed in the region in which the gate electrodes 165 are removed in the upper gap regions UR. Thus, gate structures 160, including the gate dielectric layer 162, the gate electrode 165, the spacer layers 164, and the gate capping layer 166, may be formed.

Next, referring to FIG. 2, contact plugs 180 may be formed.

First, the interlayer insulation layer 190 may be patterned to form contact holes, and a conductive material may fill the contact holes to form the contact plugs 180. The contact holes may be formed by removing the interlayer insulation layer 190 at opposite sides adjacent to the gate structure 160 using an additional mask layer such as a photoresist pattern. Bottom surfaces of the contact holes may be recessed into the source/drain regions 150 or may have a curvature along the top surface of the source/drain regions 150. In example embodiments, shapes and dispositions of the contact plugs 180 may be variously changed.

As described above, a structure and a shape of a source/drain region may be controlled to provide a semiconductor device having improved electrical characteristics.

While example embodiments have been shown and described above, it will be apparent to those skilled in the art that modifications and variations could be made without departing from the scope of the present inventive concept as defined by the appended claims.

What is claimed is:

1. A semiconductor device comprising:
    an active region on a substrate extending in a first direction, the active region having an upper surface and sidewalls;
    a plurality of channel layers on the active region to be vertically spaced apart from each other;
    a gate electrode extending in a second direction to intersect the active region and surrounding the plurality of channel layers; and
    a source/drain region on the active region on at least one side of the gate electrode, capping the plurality of channel layers along the at least one side of the gate electrode, and extending from the sidewalls of the active region having a major width in the second direction between first protruding points in a first region adjacent to a lowermost channel layer adjacent to the active region among the plurality of channel layers,
    wherein the source/drain region has a width smaller than the major width in a region above the first region, and the first protruding points protrude, in the second direction, further than second protruding points in the region above the first region.

2. The semiconductor device of claim 1, wherein the plurality of channel layers include first to third channel layers stacked sequentially from the active region, and
    the first region is higher than the upper surface of the active region and lower than an upper surface of the first channel layer.

3. The semiconductor device of claim 2, wherein the source/drain region has a first major width that is the major width, in the first region, and has a second major width, less than the first major width, in a second region having a height corresponding to a height at which the third channel layer is disposed.

4. The semiconductor device of claim 3, wherein the source/drain region includes a region having a third width, less than the first major width and the second major width, between the first region and the second region.

5. The semiconductor device of claim 3, wherein the source/drain region has a fourth major width, less than the first major width, in a third region having a height corresponding to a height at which the second channel layer is disposed.

6. The semiconductor device of claim 1, wherein the source/drain region has a first surface extending from the sidewall of the active region inclined with respect to the upper surface of the substrate, and the first surface is a facet along a crystal plane.

7. The semiconductor device of claim 6, wherein the source/drain region has a second surface connected to the first surface, and the second surface is a facet along a crystal plane.

8. The semiconductor device of claim 7, wherein the source/drain region has the major width on a boundary between the first surface and the second surface.

9. The semiconductor device of claim 1, further comprising:
    spacer layers on the sidewalls of the active region to expose the upper surface and portions of side surfaces of the active region.

10. The semiconductor device of claim 9, wherein the source/drain region is in contact with the spacer layers and cover an entire sidewall of the active region exposed by the spacer layers.

11. The semiconductor device of claim 1, further comprising:
    internal spacer layers on opposite sides of the gate electrode in the first direction on lower surfaces of the plurality of channel layers.

12. The semiconductor device of claim 11, wherein the source/drain region has a local minimum width further reduced in the second direction in regions having a height corresponding to a height of each of the internal spacer layers when compared to a width in the second direction in regions having a height corresponding to a height of each of the plurality of channel layers.

13. The semiconductor device of claim 1, further comprising:
    a contact plug connected to the source/drain region.

14. The semiconductor device of claim 13, wherein the contact plug is recessed in the source/drain region below a height of an uppermost channel layer, among the plurality of channel layers.

15. The semiconductor device of claim 1, wherein the active region is a structure of an active fin having an upper fin surface and sides running in the first direction.

16. A semiconductor device comprising:
an active region extending on a substrate in a first direction;
first and second channel layers sequentially on the active region to be vertically spaced apart from each other;
a gate electrode extending in a second direction to intersect the active region on the substrate and surrounding the first and second channel layers; and
a source/drain region on the active region on at least one side of the gate electrode and disposed to be in contact with the first and second channel layers,
wherein the source/drain region has a first major width in the second direction between first protruding points and a second major width in the second direction between second protruding points,
the first major width being a largest width of a first region, the first region having a height corresponding to a height between an upper surface of the first channel layer and the active region,
the second major width being a largest width in a second region adjacent to the second channel layer, the second region having a height corresponding to a height of the second channel layer, and
the second major width is less than the first major width.

17. The semiconductor device of claim 16, wherein the source/drain region has a side surface extending from the active region to the first region having the first major width, and the side surface of the source/drain region is a facet along a crystal plane.

18. The semiconductor device of claim 16, wherein the source/drain region has a third width, less than the first major width and the second major width, between the first region having the first major width and the second region having the second major width.

19. A semiconductor device comprising:
an active region extending on a substrate in a first direction having an upper surface and sidewalls;
a gate electrode extending in a second direction to intersect the active region on the substrate;
a plurality of channel layers on the active region to be vertically spaced apart from each other in a region in which the active region and the gate electrode intersect each other;
spacer layers on the sidewalls of the active region in the second direction and exposing the upper surface and portions of the sidewalls of the active region; and
a source/drain region disposed on the active region on at least one side of the gate electrode and disposed to be in contact with the plurality of channel layers,
wherein the source/drain region extends from the sidewalls of the active region, exposed by the spacer layers, and inclined with respect to an upper surface of the substrate to have a width expanding from both sides of the active region,
the source/drain region has a major width in the second direction between first protruding points in a region adjacent to a lowermost channel layer adjacent to the active region among the plurality of channel layers,
the major width is in a region having a height corresponding to a height between the lowermost channel layer and the active region, and
a first distance, in the second direction, between a side surface of the lowermost channel layer and a nearest first protruding point is greater than a second distance, in the second direction, between a side surface of another of the plurality of channel layers and a nearest second protruding point of the source/drain region.

20. The semiconductor device of claim 19, wherein the source/drain region has a curvature corresponding to a height of the channel layers in a region adjacent to other overlying channel layers.

* * * * *